United States Patent [19]

Fujii

[11] Patent Number: 4,536,662
[45] Date of Patent: Aug. 20, 1985

[54] BIDIRECTIONAL CONSTANT CURRENT DRIVING CIRCUIT

[75] Inventor: Akira Fujii, Tokyo, Japan
[73] Assignee: NEC Corporation, Tokyo, Japan
[21] Appl. No.: 550,477
[22] Filed: Nov. 9, 1983
[30] Foreign Application Priority Data Nov. 15, 1982 [JP] Japan .................. 57-200115

[51] Int. Cl.$^3$ .............................................. H03K 3/26
[52] U.S. Cl. ........................ 307/270; 307/262;
307/297; 330/267; 330/284; 330/288; 323/315;
455/126; 455/127
[58] Field of Search .............. 455/116, 117, 126, 127;
307/255, 270, 297, 262; 323/312, 315, 316;
330/267, 268, 284, 288

[56] References Cited

U.S. PATENT DOCUMENTS

| | | | |
|---|---|---|---|
| 3,662,290 | 5/1972 | Elliot | 455/126 |
| 3,979,610 | 9/1976 | Gordon | 323/315 |
| 4,335,360 | 6/1982 | Hoover | 330/264 |
| 4,399,374 | 8/1983 | Boeke | 307/297 |
| 4,433,303 | 2/1984 | Sasaki | 330/288 |
| 4,461,991 | 7/1984 | Smith | 307/297 |
| 4,485,351 | 11/1984 | Schemmel et al. | 330/288 |

Primary Examiner—Jin F. Ng
Attorney, Agent, or Firm—Laff, Whitesel, Conte & Saret

[57] ABSTRACT

A bidirectional constant current driving circuit is connected between the positive and negative terminals of a power supply. This drive circuit has an input terminal and an output terminal with a load coupled to the output terminal, and with the current supplied thereto being controlled to vary in either a positive or a negative electrical direction. The inventive driving circuit has four transistors. A first and second of these transistors have a first electrode connected to the first power supply terminal. The second transistor has second and third electrodes connected to a second electrode of the first transistor. A third and fourth of these transistors have a first electrode connected to the second power supply terminal. The fourth of these transistors has second and third electrodes connected to a second electrode of the third transistor. First and second resistors are serially connected between the third electrodes of the second and fourth transistors. The junction of the first and second resistors are connected to the input terminal. The third electrodes of the first and third transistors are coupled to the output terminal.

6 Claims, 3 Drawing Figures

BIDIRECTIONAL CONSTANT CURRENT DRIVING CIRCUIT

BACKGROUND OF THE INVENTION

This invention relates to bidirectional constant current driving circuits which are capable of driving variable attenuators and the like. The invention uses PIN diodes with constant currents, in both positive and negative directions.

Traditionally, constant current driving circuits supply constant current irrespective of impedance variations of the loads driven by such current. Typically, such a circuit applies a voltage to the base of a transistor, the emitter of which is connected to a resistor. The transistor drives a load which is connected to its collector. This kind of driving circuit is often used because it has a simple structure; however, it also has a disadvantage since it provides a constant current in only one electrical direction.

SUMMARY OF THE INVENTION

An object of the invention is to eliminate the above-mentioned disadvantage and to provide a bidirectional constant current circuit which is capable of giving constant currents in both a positive and a negative electrical direction.

According to the invention, a bidirectional constant current driving circuit has an input terminal, an output terminal and first and second power supply terminals. A load is coupled to the output terminal in response to an input signal applied to the input terminal. The inventive driving circuit has four transistors. A first of these transistors has a first electrode connected to the first power supply terminal, and second and third electrodes connected to a second electrode of the first transistor. A third of these transistors has as first electrode connected to the second power supply terminal. A fourth of these transistors has a first electrode connected to the second power supply terminal, and second and third electrodes connected to a second electrode of the third transistor. First and second resistors are serially connected between the third electrodes of the second and fourth transistors. The junction of the first and second resistors are connected to the input terminal. The third electrodes of the first and third transistors are coupled to the output terminal.

PREFERRED EMBODIMENTS OF THE INVENTION

Figure 1:
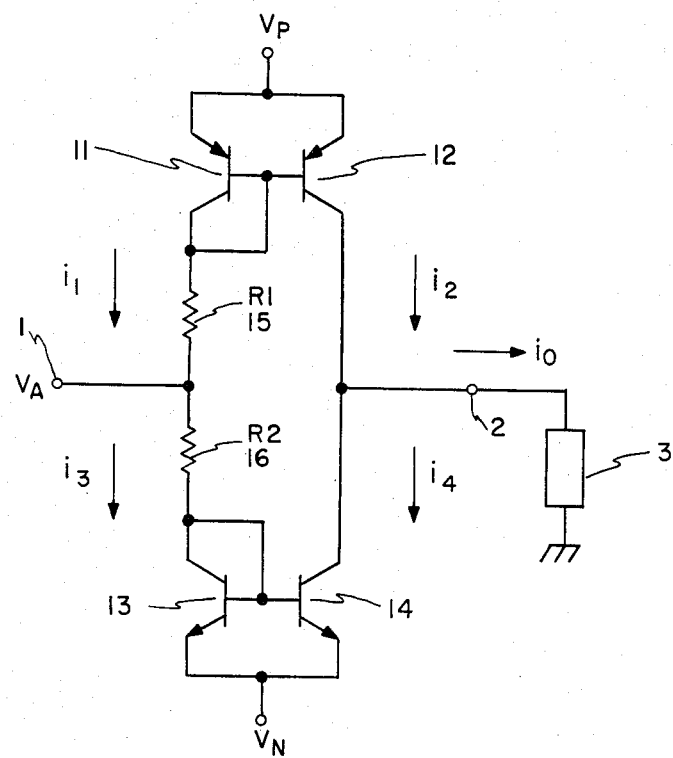
FIG. 1 is a schematic circuit diagram illustrating a preferred embodiment of the inventive bidirectional constant current driving circuitry.

FIG. 1 shows the circuit of a preferred embodiment of the present invention, which includes a matched pair of PNP transisters 11, 12, each being connected in series with an individually associated one of a matched pair of NPN transistors 13, 14. The resulting two series circuits are connected in parallel between the terminals $V_p$ and $V_n$ of a power supply. A series connected pair of control resistors 15, 16 is interposed between transistor electrodes of a first of the series connected transistors 11, 13. Each of the transistors 11, 13 has its collector connected to its base and in turn, to the base of an individually associated and corresponding one of the transistors in a second of the series connected transistors 12, 14. An input terminal 1, is connected to the junction between resistors 15, 16. The output terminal 2 is connected to collectors of the other of the series connected pair of transistors 12, 14.

The operation of the circuit of FIG. 1 will be briefly described below. A control voltage ($V_A$) is fed from an external circuit to an input terminal 1. If the base current is ignored, the collector current i1 of PNP transistor 11 is $$i1 = \frac{V_p - V_{BE1} - V_A}{R1}$$

where: $V_{BE1}$ is the voltage between the emitter and base electrodes of the PNP transistor 11; $V_p$ is the potential level of the positive power supply voltage; and R1 is the resistance of a resistor 15. Meanwhile, the collector current 13 of NPN transistor i3 is $$i3 = \frac{V_A - V_N - V_{BE2}}{R_2}$$

where: $V_{BE2}$ is the voltage between the base and emitter electrodes of the NPN transistor 13; $V_N$ is the negative power supply voltage; and R2 is the resistance of a resistor 16. If the characteristics of PNP transistors 11 and 12 are matched, the collector current i2 of the PNP transistor 12 is $$i2 = i1.$$

Likewise, if the characteristics of NPN transistors 13 and 14 are matched, the collector current i4 of the NPN transistor 14

$$i4 = i3$$

Accordingly, an output current from the output terminal 2 to load 3 is $$i0 = i2 - i4$$
$$= i1 - i3$$
$$= \frac{V_p - V_{BE1} - V_A}{R1} - \frac{V_A - V_N - V_{BE2}}{R2}$$
$$= -V_A\left(\frac{1}{R2} + \frac{1}{R2}\right) + \left(\frac{VP}{R1} + \frac{VN}{R2}\right) +$$

$$\left(\frac{V_{BE1}}{R1} - \frac{V_{BE2}}{R2}\right)$$

If, for simplicity, it is supposed that $R1 = R2$
$V_p + V_N = 0$
$V_{BE1} = V_{BE2}$
then, -continued
$$io = \frac{2}{R1} V_A$$

Thus, the output current i0 is found to be proportional to the input control voltage $V_A$. Moreover, as is obvious from the circuit structure, the output current can be given in either direction, positive or negative. Furthermore, a very wide range of terminal voltages may be selectively applied to the load, without adversely affecting the operation. This wide range extends from a voltage which is extremely close to the voltage at either the positive or the negative power supply voltage, unless the PNP transistor 12 or the NPN transistor 14 becomes saturated. The PNP transistor has an inverse conductive junction with respect to the conductive junction of the NPN transistor.

Figure 2:
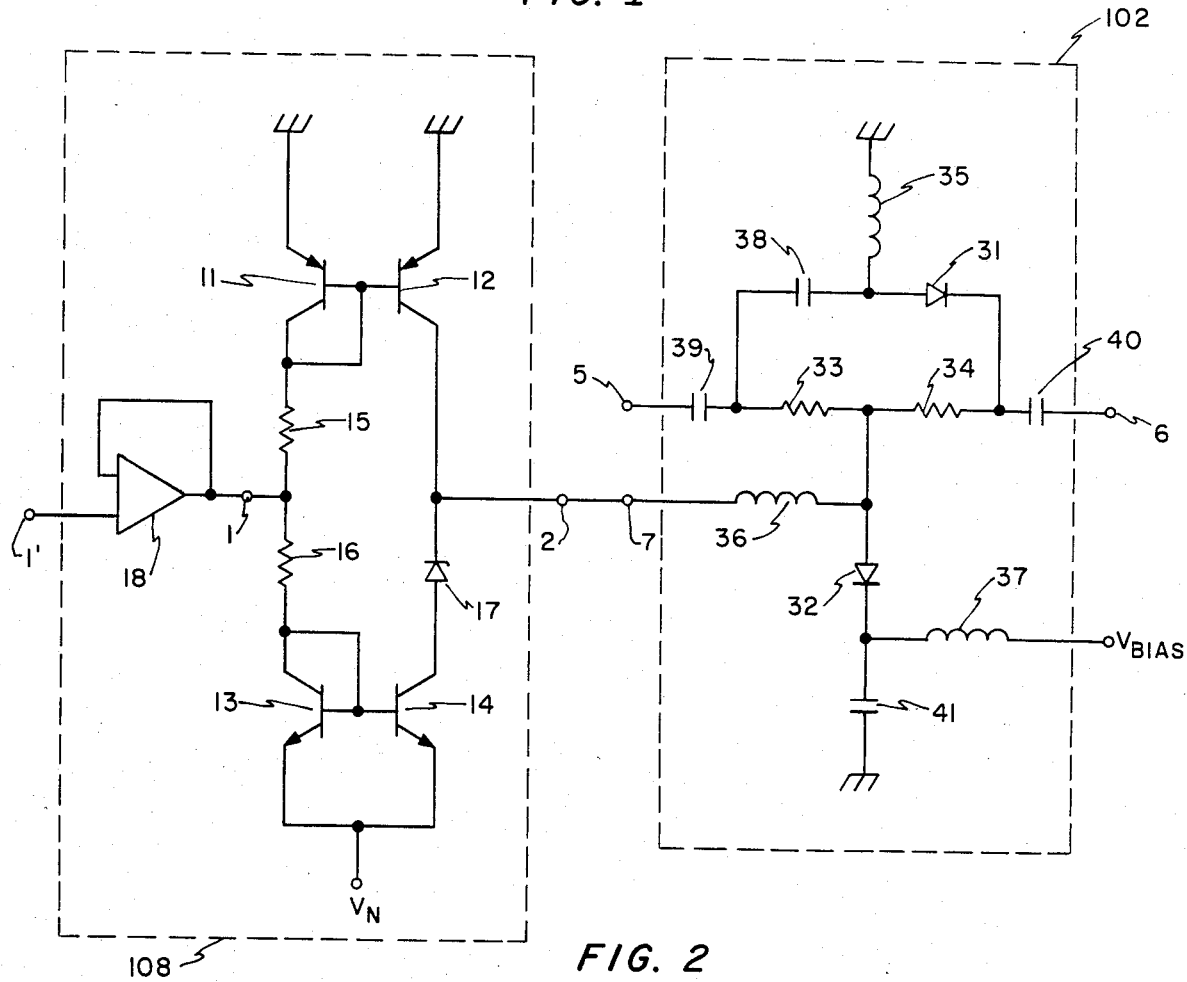
FIG. 2 is a schematic circuit diagram illustrating an example in which the bidirectional constant current driving circuit of FIG. 1 is used to drive a high-frequency variable attenuator having PIN diodes.

Next, FIG. 2 illustrates an example in which the bidirectional constant current of FIG. 1 is used to drive a high-frequency variable attenuator using PIN diodes. The same reference numerals are used in both FIG. 1 and FIG. 2 to identify the same respective parts.

In addition to the circuit shown in FIG. 1, constant current driving circuit 108 includes a Zener diode 17 and a buffer amplifier 18. A variable attenuator 102 may be a generally known circuit, comprising PIN diodes 31 and 32, resistors 33 and 34, choke coils 35 to 37 and capacitors 38 to 41. In this variable attenuator 102, the attenuation from an input terminal 5 to an output terminal 6 exhibits a characteristic wherein the attenuation decreases when the current through the PIN diode 31 increases and the current through the PIN diode 32 decreases. The attenuation of circuit 102 increases when the reverse occurs (i.e. current decreases in PIN diode 31 and increases in PIN diode 32).

In order to achieve a satisfactory temperature stability characteristic, a temperature-compensated constant voltage ($V_{BIAS}$) is applied to variable attenuator 102 via choke coil 37 and further a constant current is applied through the choke coil 36 to drive variable attenuator 102.

This driving current may be in either the positive or the negative electrical directions, depending on the extent of the attenuation. This bidirectional current may be achieved by the use of the inventive bidirectional constant current driving circuit. In this circuit, the terminal voltage at the driving point is about $-0.6$ V, which is extremely close to the ground potential; therefore, this embodiment is very economical because it can use a single-power supply circuit, with its positive power supply terminal being grounded.

In this preferred embodiment, the Zener diode 17 is inserted into the collector circuit of the transistor 14 to decrease its collector loss and thereby prevent a heavy disturbance of the thermal balance between the transistors 13 and 14. The control voltage is applied through the buffer amplifier 18 which is an operational amplifier, of the voltage-follower type. However, the Zener diode 17 and the buffer amplifier 18 are used only as required, and are not indispensable for the invention.

Figure 3:
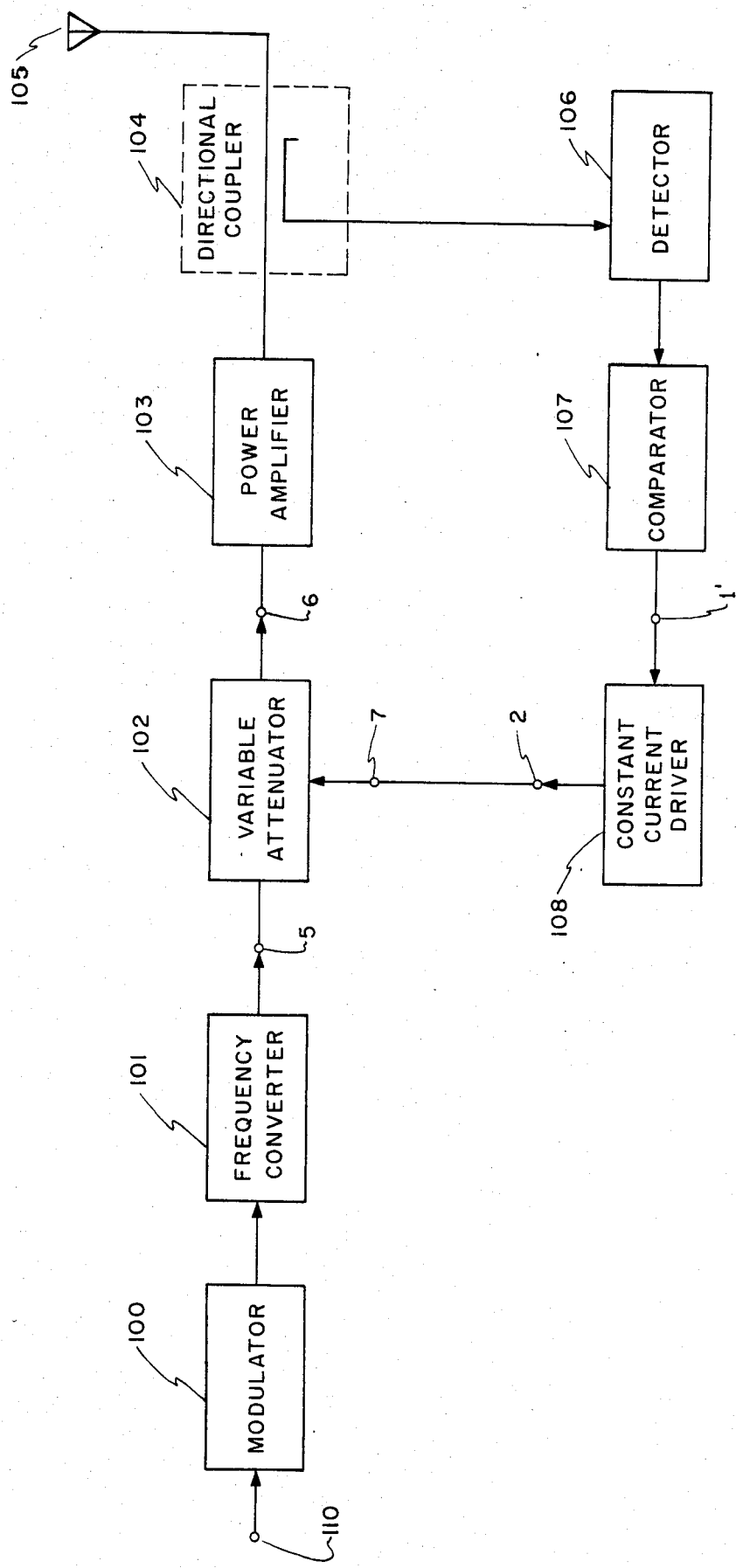
FIG. 3 is a block diagram illustrating an example in which the circuit of FIG. 2 is used to regulate the transmitting power for a radio transmitter.

FIG. 3 illustrates an example in which the circuit of FIG. 2 is used in a transmitting power control circuit for a radio transmitter. FIGS. 2 and 3 use the same reference numerals to identify the same structure.

A modulator 100 (an FM modulator, for example) modulates a carrier wave responsive to an input signal which is supplied to a terminal 110. The modulated carrier wave is frequency-converted by a frequency converter 101, and then is supplied to a power amplifier 103 by way of the variable attenuator 102. The output of the power amplifier 103 is sent out through a directional coupler 104 and an antenna 105. Further, a part of the output of the amplifier 103 is taken out of the directional coupler 104. The level of this taken out signal is level-detected by a detector 106, and compared with a reference level by a comparator 107. The resultant differential voltage is supplied to an input terminal 1' of the constant current driving circuit 108, which, in turn, controls the attenuation of the attenuator 102 responsive to the differential voltage. The attenuator 102 response keeps the output of the transmitter (i.e. that of the amplifier 103) at a constant level.

Those who are skilled in the art will readily perceive how to modify the system. Therefore, the appended claims are to be construed to cover all equivalent structures which fall within the true scope and spirit of the invention.

The claimed invention is:

1. A bidirectional constant current driving circuit having an input terminal, an output terminal and first and second power supply terminals, for driving a load coupled to said output terminal in response to an input signal applied to said input terminal, said driving circuit comprising: first transistor means having a first electrode connected to said first power supply terminal; second transistor means having a first electrode connected to said first power supply terminal, and second and third electrodes connected to a second electrode of said first transistor means; third transistor means having a first electrode connected to said second power supply terminal; fourth transistor means having a first electrode connected to said second power supply terminal, and second and third electrodes connected to a second electrode of said third transistor means; first and second resistor means serially connected between the third electrode of said second transistor means and the third electrode of said fourth transistor means, the junction of said first and second resistor means being connected to said input terminal; and means for coupling third electrodes of said first and third transistor means to said output terminal.

2. A bidirectional constant current driving circuit as claimed in claim 1, wherein each of said first and second transistor means has an inverse conductive junction structure with respective to the conductive junction structure of each of said third and fourth transistor means.

3. A bidirectional constant current driving circuit as claimed in claim 1, wherein each of said first and second transistor means comprises a PNP transistor, and each of said third and fourth transistor means comprises an NPN transistor.

4. A bidirectional constant current driving circuit as claimed in claim 3, wherein said coupling means includes a Zener diode coupled between said output terminal and the third electrode of said third transistor means.

5. A bidirectional constant current driving circuit as claimed in claim 1, wherein said coupling means includes a Zener diode coupled between said output terminal and the third electrode of said third transistor means.

6. A bidirectional constant current driving circuit as claimed in claim 1, wherein said first, second, third electrodes are emitter, base and collector electrodes, respectively, on each of the transistors.

* * * * *